United States Patent [19]

Hargasser

[11] Patent Number: 5,107,326

[45] Date of Patent: Apr. 21, 1992

[54] HIGH-FREQUENCY SMD TRANSISTOR HAVING TWO EMITTER TERMINALS

[75] Inventor: Hans Hargasser, Munich, Fed. Rep. of Germany

[73] Assignee: Siemens Aktiengesellschaft, Munich, Fed. Rep. of Germany

[21] Appl. No.: 643,128

[22] Filed: Jan. 18, 1991

[30] Foreign Application Priority Data

Jan. 31, 1990 [EP] European Pat. Off. ......... 90101916.6

[51] Int. Cl.$^5$ .................... H01L 23/48; H01L 23/50
[52] U.S. Cl. ........................ 357/70; 357/68; 357/72
[58] Field of Search ............... 357/70, 68, 72

[56] References Cited

U.S. PATENT DOCUMENTS 4,556,896 12/1985 Meddles ................. 357/70

FOREIGN PATENT DOCUMENTS

| 1564563 | 9/1969 | Fed. Rep. of Germany | 357/72 |
| 2110575 | 6/1972 | France | |
| 0265457 | 11/1988 | Japan | 357/72 |
| 1137619 | 12/1968 | United Kingdom | |
| 1175122 | 12/1969 | United Kingdom | |

OTHER PUBLICATIONS

Grenier H., "Entwicklungstendenzen bei diskreten Transistoren unter besonderer Beachtung der Aufsetztechnik," Nachrichtentechnik Elektronik, vol. 37, No. 5, pp. 169-174.

Primary Examiner—Rolf Hille
Assistant Examiner—S. V. Clark
Attorney, Agent, or Firm—Hill, Van Santen, Steadman & Simpson

[57] ABSTRACT

A high-frequency SMD transistor having two emitter terminals is provided in which a semiconductor chip is secured on a lead frame and is contacted to electrical terminals on the lead frame in a manner to enable minimum semiconductor chip dimensions given high reliability. The two emitter terminals of the high-frequency SMD transistor are fashioned of one piece within the lead frame. A single electrical connection is present between the emitter contact of the semiconductor chip and the two one-piece emitter terminals.

3 Claims, 4 Drawing Sheets

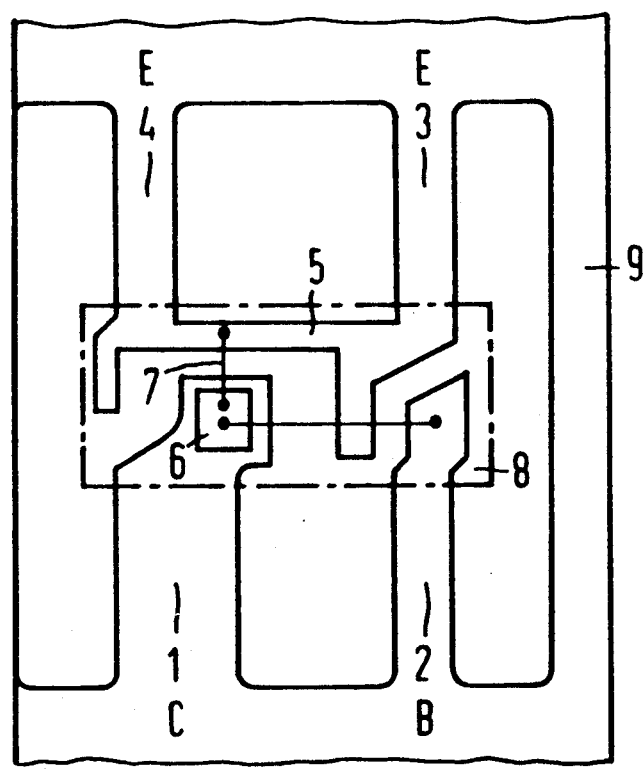

HIGH-FREQUENCY SMD TRANSISTOR HAVING TWO EMITTER TERMINALS

CROSS REFERENCE TO RELATED APPLICATIONS

This application is related to an application Ser. No. 07/643,126, filed Jan. 18, 1991.

BACKGROUND OF THE INVENTION

1. Field of the Invention

The present invention relates to a high-frequency surface mounted device (SMD) transistor having two emitter terminals in which a semiconductor transistor chip is secured upon a lead frame and is contacted to electrical terminals on the lead frame, and to a lead frame for the SMD transistor.

2. Description of the Prior Art

In particular, the present invention relates to SMD device having the format SOT-143 as generally illustrated in FIGS. 1 and 2 in which FIG. 1 illustrates, in a plan view, a SMD component having the SOT-143 format. FIG. 2 illustrates an end view of the same electronic component of FIG. 1.

In FIG. 1, electrical terminals 1-4 are illustrated for an SMD component. The electrical terminal (PIN) 1 thereby usually references the collector. The electrical terminal 4 usually references an emitter terminal. In a first embodiment of the SMD component, the electrical terminal 2 can reference a further emitter terminal and the electrical terminal 3 can reference a base terminal. In a second embodiment of the SMD component, the electrical terminal 2 can reference a base terminal and the electrical terminal 3 can reference a further emitter terminal.

Bipolar, high-frequency broadband transistors having the SOT-143 format with four electrical terminals 1-4 achieve noticeably greater amplification at high frequencies when compared to SMD components having the SOT-23 format that only has three electrical terminals, this because of reduced emitter-lead inductance and because of reduced capacitive coupling between the collector and the base.

In known high-frequency SMD transistors having two emitter terminals, a semiconductor transistor chip is seated on a lead frame. The semiconductor transistor chip is usually electrically connected to the two emitter terminals of the SMD component via two electrical bond wires.

FIGS. 3-11 illustrate applied examples of various semiconductor chips in combination with standard lead frames. In the smaller figures of applied examples, respective electronic SMD components each have respectively four electrical terminals 1-4. In FIG. 3, two semiconductor chips are secured on the electrical terminal 1 and the respective semiconductor chip is secured on each of the electrical terminals 2 and 4. In FIG. 4, two semiconductor chips are secured on the electrical terminal 1 and one semiconductor chip is secured on the electrical terminal 2. In FIG. 5, a single semiconductor chip is secured on the electrical terminal 1. This single semiconductor chip is contacted via bond wires to the electrical terminals 2-4. In FIG. 6, a respective single semiconductor chip is secured on each of the electrical terminals 1 and 2. In FIG. 7, a respective single semiconductor chip is secured on each of the electrical terminals 3 and 4. FIG. 8 illustrates a lead frame having the electrical terminals 1-4 before the fastening and contacting of semiconductor chips on the lead frame.

FIGS. 9-11 illustrate three applied examples in which, respectively, a single semiconductor chip is secured on the electrical terminal 1. In the three applied examples of FIGS. 9-11, respectively two bond wires are employed for contacting the semiconductor chip to two emitter terminals of the SMD component. In these three applied examples of FIGS. 9-11, respectively two emitter terminals are conducted out of the envelope of the finished SMD component when the SMD component is finished. In FIG. 9, the two electrical terminals 2 and 4 form respective emitter leads. The semiconductor chip is contacted to the two electrical terminals 2 and 4 with, for example, a "double nail head". In the applied example of FIG. 10, the semiconductor chip has two emitter contacting spots. These two emitter contacting spots are each respectively electrically connected to one of the two emitter terminals 2, 4 via bond wires. In the applied example of FIG. 11, the semiconductor chip is electrically connected to the two emitter terminals 3, 4 via bond wires on the basis of a double nail head method.

The method according to FIGS. 9 and 11 of pressing two nail heads against one another on a semiconductor chip is all the more critical in high-speed automatic contacting units the smaller the contacting areas or, respectively, wire diameters are selected. In the applied example of FIG. 10, the two contacting spots that are arranged side-by-side on the semiconductor chip can be faultlessly contact in terms of process technology. The two contacting spots, however, must be arranged at a defined distance from one another, this leading to an increase in the size of the semiconductor chip dimensions and, therefore, to an increase in expense. Also added thereto is the negative influence of the collector-emitter capacitance of the contacting spots on the gain or amplification of the SMD component in the region of high frequencies, for example in the region of 2 GHz.

SUMMARY OF THE INVENTION

It is therefore the object of the present invention to provide a high-frequency SMD transistor of the type initially set forth and a lead frame of the type initially set forth that enable minimum semiconductor chip dimensions given high reliability.

The above object is achieved, according to the present invention, by a high-frequency SMD transistor and a corresponding lead frame which are characterized by a one-piece construction of the two emitter terminals of the high-frequency SMD transistor within a lead frame and by a single electrical connection between the emitter contact of the semiconductor transistor chip and the two emitter terminals fashioned of one piece.

According to an advantageous feature of the invention, the high-frequency SMD transistor is particularly characterized by the SOT-143 SMD format.

According to another advantageous feature of the invention, the high-frequency SMD transistor is characterized by emitter pins which lie diagonally opposite one another.

According to another advantageous feature of the invention, the high-frequency SMD transistor is characterized by emitter pins which are arranged at a single long side of the SMD component.

According to another advantageous feature of the invention, the lead frame is characterized by a one-piece construction of the two emitter terminals within the lead frame.

According to another advantageous feature of the invention, the lead frame is characterized by the utilization thereof for the SMD format SOD-143.

The present invention enables a "one-wire solution" in comparison to the two-wire solution with, for example, the double nail head method or with some other contacting method according to FIGS. 9 and 11.

The one-wire solution of the present invention is characterized by a connection of the two emitter pins within the lead frame on the basis of a specific punching of the lead frame and by the connection of the emitter on the semiconductor chip to the lead frame via a single bond wire. This single bond wire can advantageously have a relatively short length and, therefore, cause a low emitter-lead inductance.

Advantages of the one-wire solution according to the present invention are:
   Low manufacturing costs due to elimination of a second bond wire for the emitter contacting;
   Increasing the yield in comparison to the double nail head method according to FIGS. 9 and 11;
   Minimum semiconductor chip dimensions are possible and only a single contacting spot for contacting the emitter terminals is required; and
   High reliability of the manufacturing method and of the finished SMD component.

BRIEF DESCRIPTION OF THE DRAWINGS

Other objects, features and advantages of the invention, its organization, construction and operation will be best understood from the following detailed description, taken in conjunction with the accompanying drawings, on which:

FIGS. 12 and 14 are plan views illustrating exemplary embodiments of the present invention.

DESCRIPTION OF THE PREFERRED EMBODIMENTS

Figure 1:
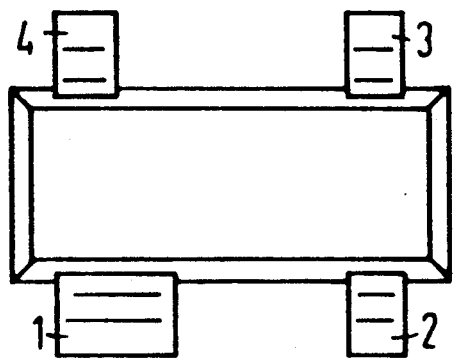
FIGS. 1 and 2 are respective plan and end views illustrating the SMD format SOT-143.
Figure 2:
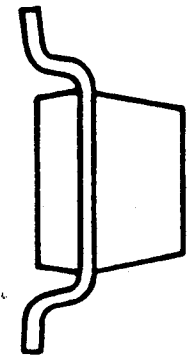
Figure 3:
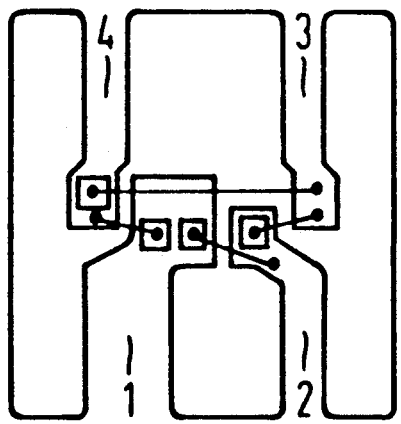
FIGS. 3-11 illustrate various applied examples having various semiconductor chips in combination with standard lead frames.
Figure 4:
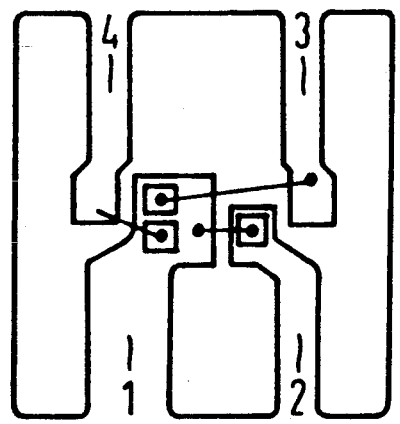
Figure 5:
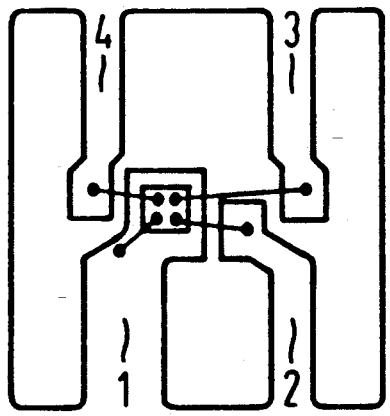
Figure 6:
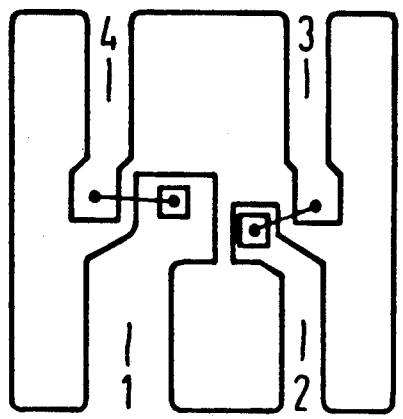
Figure 7:
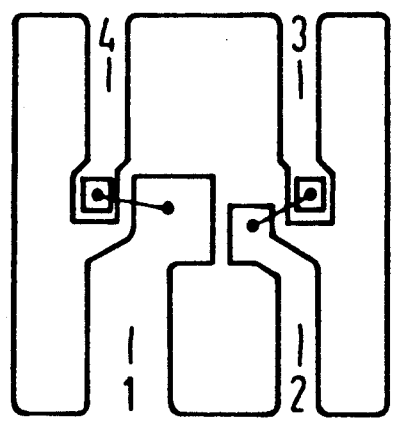
Figure 8:
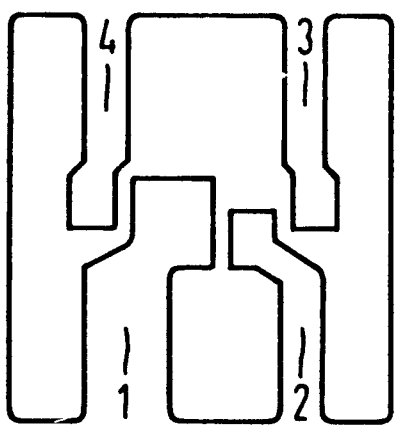
Figure 9:
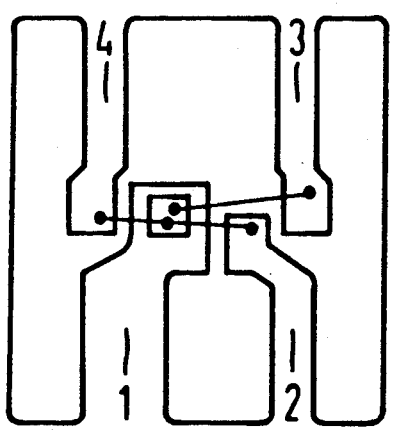
Figure 10:
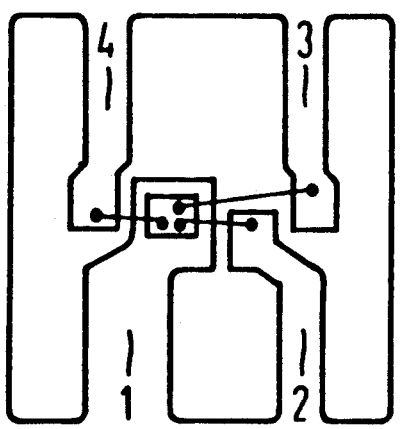
Figure 11:
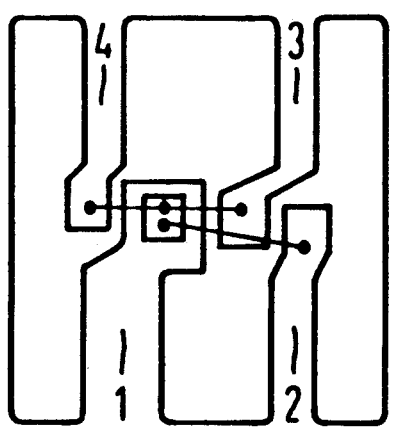
Figure 12:
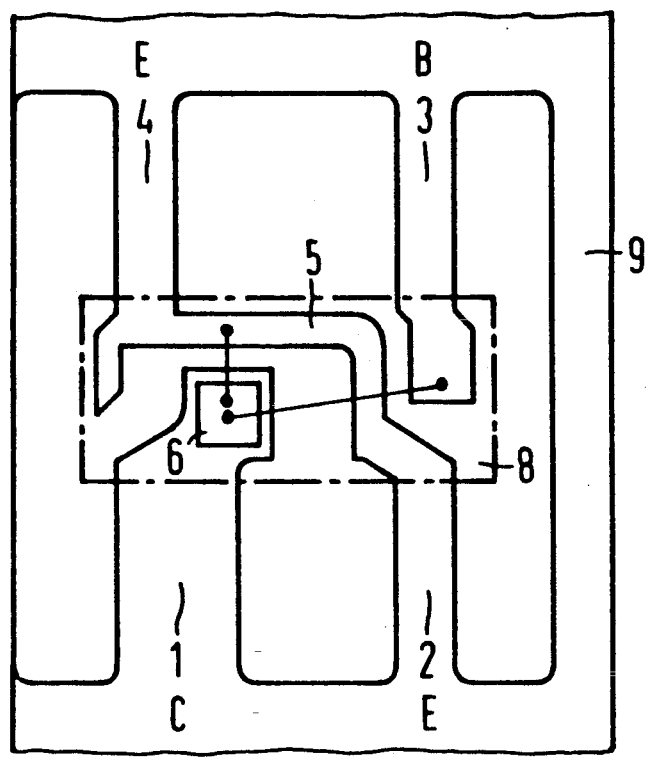

FIGS. 12 and 14 illustrate two respective exemplary embodiments of the invention. In FIG. 12, the two emitter terminals 2 and 4 are conducted to one another in an electrically conductive fashion within the interior of the lead frame 9 via a web 5. Together with the web 5, the electrical terminals 2 and 4 form a member extending entirely through the lead frame 9. A semiconductor chip 6 is secured on the electrical terminal 1. The semiconductor chip 6 is electrically connected to the base terminal 3 with a bond wire. The semiconductor chip 6 has a single emitter contacting spot. This single emitter contacting spot on the semiconductor chip 6 is connected in an electrically-conductive manner to the web 5 between the two emitter terminals 2 and 4 and, therefore, is also simultaneously connected in an electrically-conductive manner to the two emitter terminals 2 and 4, being connected thereto via a bond wire 7 having a relatively short length. The SMD component is provided with an envelope 8, preferably of plastic material. The electrical terminals 1-4, finally, are mechanically separated from the lead frame 9 and are bent into their ultimate shapes. In the exemplary embodiment of FIG. 12, the two emitter terminals 2 and 4 are arranged lying diagonally opposite one another.

FIG. 14 illustrates a further exemplary embodiment of the invention in which the same reference characters are used as employed in FIG. 12 to reference elements having the same functions. In the exemplary embodiment of FIG. 14, the two emitter terminals 3 and 4 are not conducted out of the envelope 8 of the SMD component lying diagonally opposite one another as in FIG. 12, but are conducted out of a single long side of the envelope 8 and of the SMD component. The aforementioned advantages of the present invention are also realized in the exemplary embodiment according to FIG. 14. There is also an interconnection of the two emitter terminals 3 and 4 via a web 5 within the lead frame 9 and a connection of the emitter from the semiconductor chip 6 to the lead frame via a single bond wire 7 in the exemplary embodiment of FIG. 14 as well.

Figure 13:
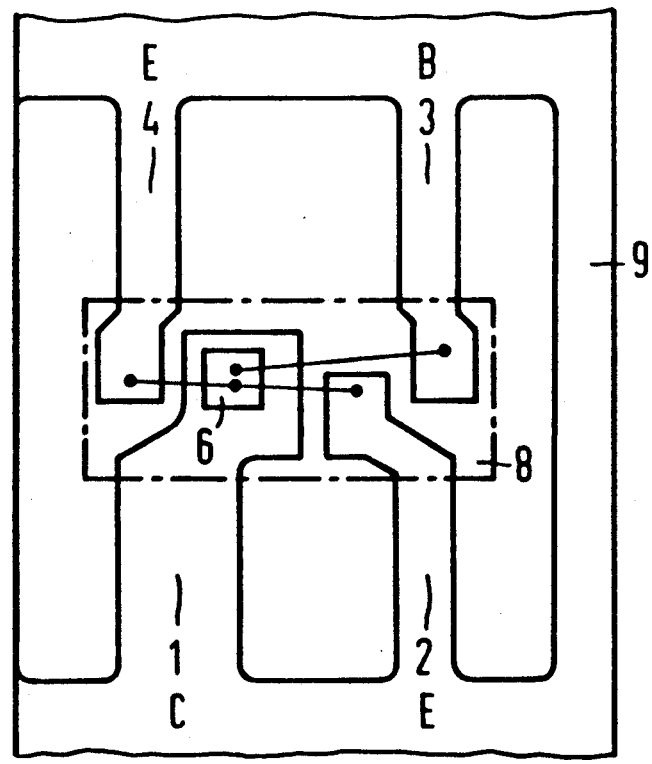
FIG. 13 is a plan view which enables a comparison of the exemplary embodiment of the present invention according to FIG. 12 to another applied sample.

By comparison to FIG. 12, FIG. 13 illustrates the differences between a double nail head method and a one-wire solution according to the present invention.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A high-frequency SMD component comprising:
   a semiconductor chip including a high-frequency transistor comprising first and second emitter contacts;
   a lead frame comprising a plurality of terminals including two emitter contact terminals and an internal web electrically connecting said two emitter terminals to said first and second contacts respectively;
   said component comprising a rectangular envelope; and
   said two emitter terminals extended from said envelope spaced apart on the same long side of said rectangular envelope of said component.

2. The high-frequency SMD component of claim 1, wherein:
   said lead frame comprises a plurality of terminals in an SOT-143 format.

3. The high-frequency SMD component of claim 1, wherein:
   said lead frame comprises a plurality of terminals in an SOT-23 format.

* * * * *